(12) United States Patent
Lu et al.

(10) Patent No.: US 7,574,890 B2
(45) Date of Patent: Aug. 18, 2009

(54) GAP-CORRECTING DEVICE

(75) Inventors: Li-Chin Lu, Guangdong (CN); Gui-Qing Deng, Guangdong (CN)

(73) Assignees: Hong Fu Jin Precision Industry (Shen Zhen) Co., Ltd., Longhua Town, Bao'an District, Shenzhen, Guangdong Province; Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 636 days.

(21) Appl. No.: 11/307,585

(22) Filed: Feb. 14, 2006

(65) Prior Publication Data
US 2006/0244189 A1 Nov. 2, 2006

(30) Foreign Application Priority Data
Apr. 29, 2005 (CN) .................... 2005 2 0057956 U

(51) Int. Cl.
*B21J 9/18* (2006.01)
*B21D 11/02* (2006.01)
*B21C 51/00* (2006.01)

(52) U.S. Cl. .................... 72/452.1; 72/301; 72/31.02

(58) Field of Classification Search ................. 72/31.02, 72/301, 302, 452.1, 452.2, 452.4, 452.6, 72/455; 29/757, 758, 761; 206/560, 565, 206/708, 722, 724; 53/472
See application file for complete search history.

(56) References Cited

U.S. PATENT DOCUMENTS 153,998 A * 8/1874 Albright ..................... 72/302

* cited by examiner

*Primary Examiner*—Dana Ross
*Assistant Examiner*—Teresa Bonk
(74) *Attorney, Agent, or Firm*—Winston Hsu

(57) ABSTRACT

A gap-correcting device used on an assembled product is disclosed. The gap-correcting device includes a load-supporting part (22), a control part (23), and a drive part (21). The control part includes a control unit and one or more hooks (235). The control unit controls the hooks to enter and hitch one part of the assembled product to correct a gap therein. The drive part is connected with the control part and the load-supporting part. The gap-correcting device is used to correct the gaps of assembled products and can replace manual correction so that the quality of gap correcting can be improved.

5 Claims, 4 Drawing Sheets

GAP-CORRECTING DEVICE

FIELD OF THE INVENTION

The present invention relates to a gap-correcting device, and particularly to a gap-correcting device for an assembled product.

DESCRIPTION OF RELATED ART

Electronic devices such as computers and mobile phones are popular all over the world nowadays. Manufacturers are working hard to improve product quality so that they are able to compete effectively in the market.

The housing of an electronic device usually includes a cover and a chassis. In the process of assembling the housing, a gap may be left in the housing because of an imprecise fit of the cover and the chassis. If allowed to remain, the gap may permit contaminants to enter the housing, and may also cause leakage of electromagnetic interference (EMI). Therefore the gap must be corrected after the initial assembly.

The gap is often corrected manually by an operator. Therefore it is difficult to ensure consistent quality, and the operator may accidentally damage the housing.

Therefore, what is needed is a gap-correcting device which easily and conveniently corrects the gap of an assembled housing.

SUMMARY OF INVENTION

A gap-correcting device is provided herein. The gap-correcting device includes a load-supporting part, a drive part, and a control part. The control part comprises a control unit and one or more hooks, wherein the control unit controls the hooks to enter and hitch part of an assembled product in order to correct a gap therein. The drive part is drivably connected with the control part and the load-supporting part and when the control part drives the drive part, the drive part drives the load-supporting part.

Further features and advantages will be provided or will become apparent in the course of the following detailed description; in which:

DETAILED DESCRIPTION

Figure 1:
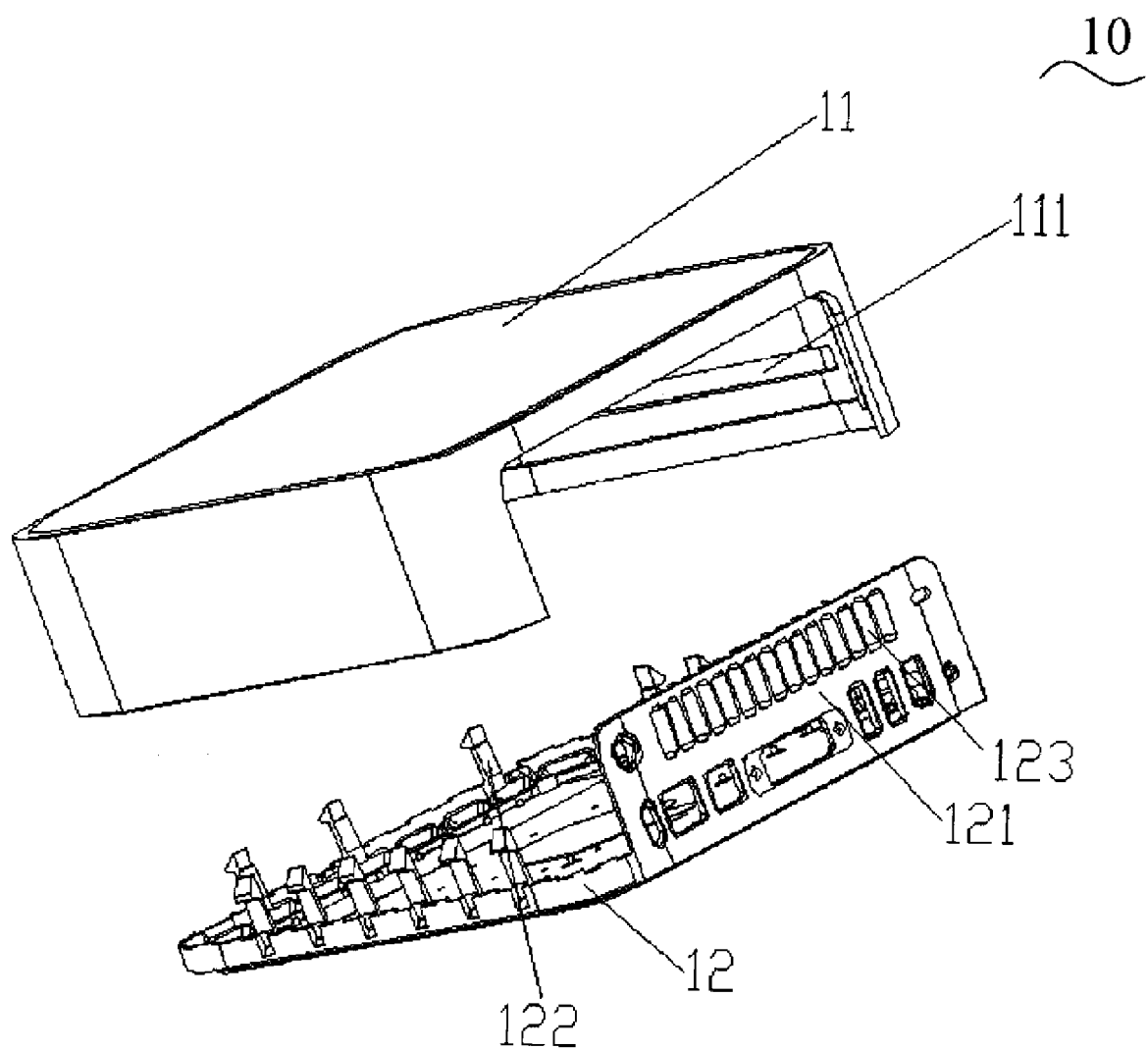
FIG. 1 is an exploded, isometric view of a housing including an cover and a chassis, the housing being a typical product that is worked upon by a gap-correcting device in accordance with a preferred embodiment of the present invention.
Figure 2:
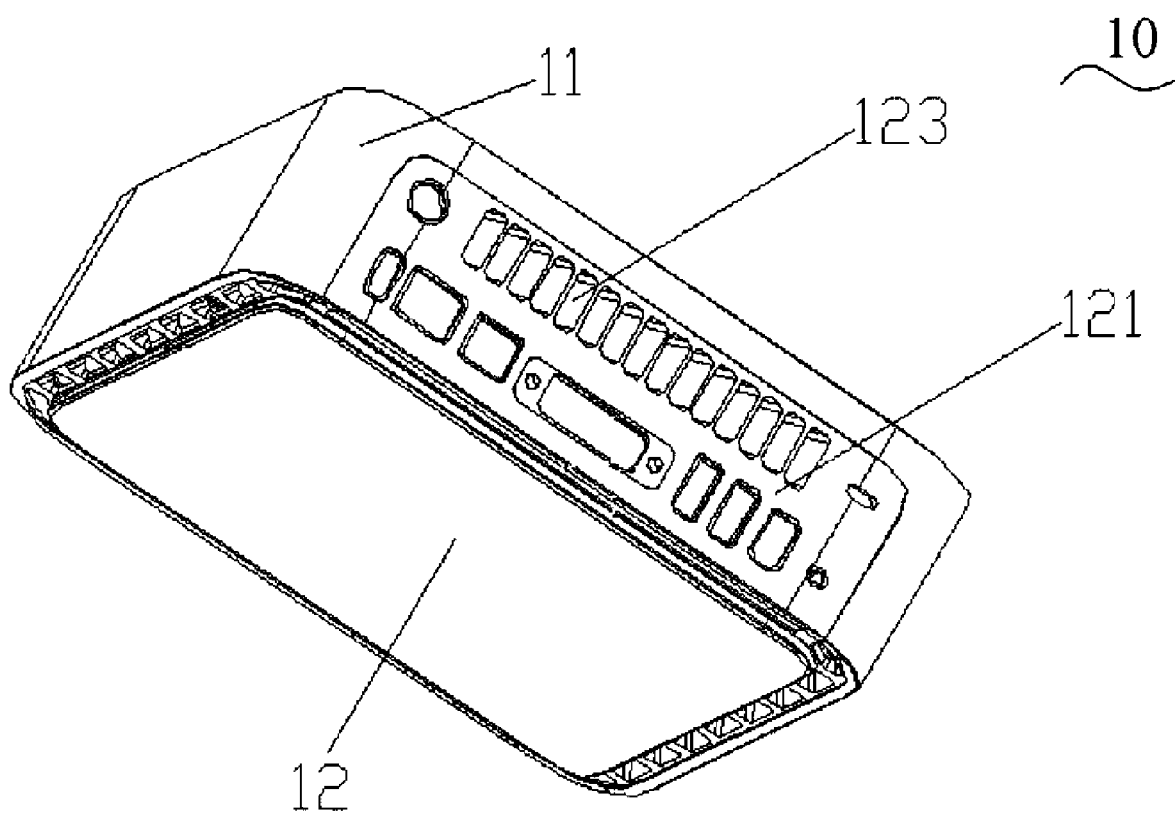
FIG. 2 is an assembled view of the housing of FIG. 1, but viewed from another aspect.

Referring to FIGS. 1 and 2, a housing including an cover and a chassis in accordance with a preferred embodiment of the present invention is shown. The cover 11 is equipped with one or more gains 111 at an inner peripheral wall thereof. Correspondingly, the chassis 12 is equipped with a plurality of grabs 122 at side edges thereof. The gains 111 and the grabs 122 cooperate to fix the cover 11 and the chassis 12 together.

An I/O interface panel 121 extends up from a front end of the chassis 12, and includes a plurality of vent holes 123.

Figure 3:
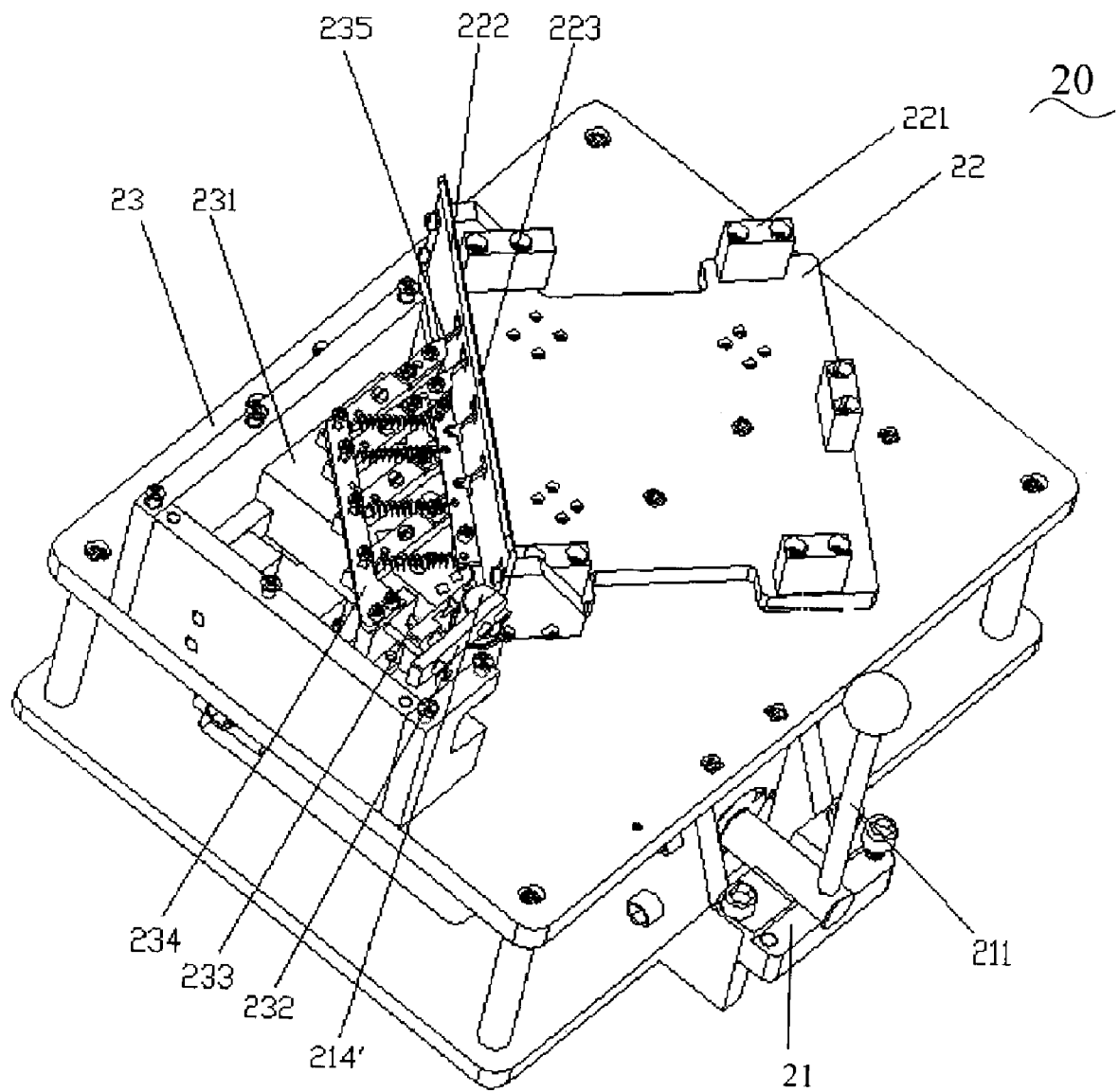
FIG. 3 is an isometric view of a gap-correcting device in accordance with the preferred embodiment of the present invention.
Figure 4:
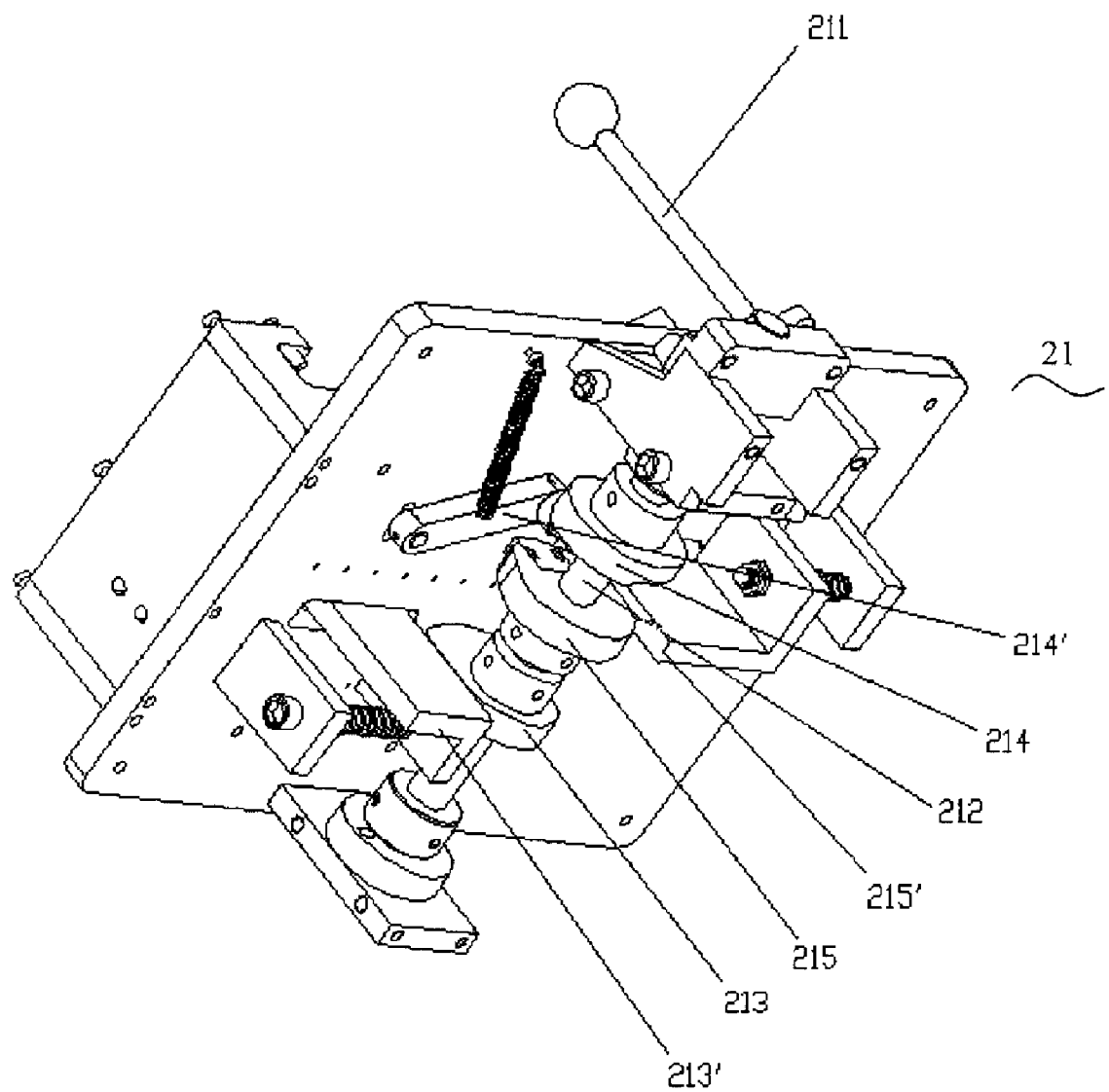
FIG. 4 is an isometric view of a drive part of the gap-correcting device of FIG. 3, viewed from a bottom aspect.

Referring to FIGS. 2, 3, and 4, the assembled housing and a gap-correcting device in accordance with the preferred embodiment of the present invention are shown. Often, after assembly of the cover 11 and the chassis 12, there will exist a gap between the I/O interface panel 121 and corresponding adjacent edges of the cover 11. The gap may be caused by a portion of the I/O interface panel 121 being bent incorrectly, or by misalignment of the I/O interface panel 121 and the cover 11. Therefore, in order to correct the gap, the gap-correcting device 20 is provided. In this description, correcting can mean completely eliminating the gap. Correcting can also mean minimizing the gap and/or making the gap more uniform.

The gap-correcting device 20 includes a drive part 21, a load-supporting part 22, and a control part 23. The drive part 21 includes a rocker arm 211, a cam shaft 212, a first cam 213, a first driving block 213' matched with the first cam 213, a second cam 214, a second driving block 214' matched with the second cam 214, a third cam 215, and a third driving block 215' matched with the third cam 215. The load-supporting part 22 includes a plurality of fixing portions 221. The fixing portions 221 are for fixing the housing 10 on the load-supporting part 22. The load-supporting part 22 is capable of moving away from the control part 23 under urging by the third driving block 215. A dummy plate 222 is provided between the load-supporting part 22 and the control part 23. The dummy plate 222 includes a plurality of through holes 223. The through holes 223 are aligned with the vent holes 123 when the housing 10 is placed on the load-supporting part 22. The control part 23 includes a translation piece 231 driven by the first driving block 213', a turning part driven by the second driving block 214', and a plurality of hooks 235. The turning part includes a turning pole 232, a connection pole 233, and a connecting piece 234. The hooks 235 are driven to move by the translation piece 231 and driven to turn by the turning part. Thus the hooks 235 enter the housing 10 and hitch onto the I/O interface panel 121, thereby correcting the gap between the cover 11 and the I/O interface panel 121.

The process of gap-correcting is as follows. Firstly, the housing 10 is placed on the load-supporting part 22, with the vent holes 123 aligned with the through holes 223. Secondly, the rocker arm 211 is turned, whereupon the camshaft 212 drives the cams (i.e., first cam 213, second cam 214, and third cam 215) to turn. When being turned, the cams 213, 214, 215 respectively drive the corresponding driving blocks (i.e., first driving block 213', second driving block 214', and third driving block 215';) to perform their respective functions. For example, the first driving block 213'; drives the translation piece 231 to move to the dummy plate 222, and drives the hooks 235 to move across the through holes 223 and enter the vent holes 123. The second driving block 214'; drives the turning pole 232 to turn, which causes the connection pole 233 to drive the connecting piece 234 to turn. Thereby, the hooks 235 turn in the housing 10 and hook in the vent holes 123. The third driving block 215'; drives the load-supporting part 22 bearing the housing 10 to move away from the dummy plate 222. However, due to the hooks 235 being hitched in the vent holes 123, the I/O interface panel 121 is pulled, thereby bending it into position. Thus the I/O interface panel 121 is aligned with the cover 11, and the gap between the I/O interface panel 121 and the cover 11 is corrected.

Moreover, it is to be understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A gap-correcting device for correcting a gap in an assembled product, the gap-correcting device comprising:
   a load-supporting part;
   a control part which comprises a control unit and one or more hooks, wherein the control unit controls the hooks to enter and hitch part of the assembled product in order to correct the gap;
   a drive part which is drivably connected with the control part and the load-supporting part, wherein when the control part drives the drive part, the drive part drives the load-supporting part; and
   a dummy plate provided between the load-supporting part and the control part, comprising a plurality of through holes.

2. The gap-correcting device of claim 1, wherein the load-supporting part comprises a plurality of fixing portions.

3. The gap-correcting device of claim 1, wherein the control unit comprises a translation piece, and the translation piece is drivably connected with the hooks for driving the hooks to move.

4. The gap-correcting device of claim 1, wherein the control unit comprises a turning unit, the turning control unit comprises a turning pole, a connection pole, and a connection piece, and the turning unit is connected with the hooks for driving the hooks to turn.

5. The gap-correcting device of claim 1, wherein the drive part comprises a rocker arm, a camshaft, a plurality of cams, and a plurality of driving blocks corresponding with the cams.

* * * * *